United States Patent [19]

Singh et al.

[11] Patent Number: 4,710,283

[45] Date of Patent: Dec. 1, 1987

[54] COLD CATHODE ION BEAM SOURCE

[75] Inventors: Bawa Singh; Peter R. Denton, both of Cherry Hill, N.J.

[73] Assignee: Denton Vacuum Inc., Cherry Hill, N.J.

[21] Appl. No.: 574,882

[22] Filed: Jan. 30, 1984

[51] Int. Cl.$^4$ .......................... C23C 14/36; H01J 27/02
[52] U.S. Cl. ................................ 204/298; 250/423 R; 315/111.81
[58] Field of Search .......................... 204/192 R, 298; 156/643; 315/111.81; 250/423 R

[56] References Cited

U.S. PATENT DOCUMENTS

| | | | |
|---|---|---|---|
| 4,166,018 | 8/1979 | Chapin | 204/192 R |
| 4,303,865 | 12/1981 | Swingler | 250/423 R |
| 4,434,038 | 2/1984 | Morrison, Jr. | 204/192 C |
| 4,507,588 | 3/1985 | Asmussen et al. | 315/39 |

OTHER PUBLICATIONS

J. L. Vossen et al, Thin Film Processes, Academic Press, New York, 1978, pp. 131-145.

Primary Examiner—John F. Niebling
Assistant Examiner—William T. Leader
Attorney, Agent, or Firm—William E. Cleaver

[57] ABSTRACT

The present device comprises, in a preferred embodiment, a permanent magnet assembly which is formed to closely resemble a doughnut with the inside surface defining an aperture having first and second ends. Said inside surface is formed concave to substantially resemble the letter "C", or a mirror image letter "C". The permanent magnet provides magnetic flux from one end of the "C" to the other and hence the magnetic flux lines, or the magnetic flux field, form, in conjunction with the concave letter "C" configuration of the permanent magnet, an enclosure. Within the enclosure there is located an anode, and the anode is shielded from electrons by the magnetic flux field. In one embodiment, in close proximity to the second end of said aperture of the permanent magnet piece there is located a cathode, while at said first end of the aperture there is located a screen. In another embodiment, which is used for sputtering, there is no screen employed. A source of electrical voltage (which has a first terminal with a first voltage and a second terminal with a second voltage, which second voltage is negative to said first voltage) has it first and second terminals respectively connected to said anode and said cathode to cause an electrostatic field therebetween. Said cathode is not coupled to said permanent magnet in a permanent way and in some uses in movable. The arrangement has a means for injecting an ionizable fluid, such as oxygen, nitrogen, argon or the like, into the region defined by the position of the magnetic flux, the position of the cathode and the position of the screen. Accordingly when electrical energy is applied to the anode and the cathode, a dense plasma results and ultimately ions pass through the screen to provide a source of ions, and/or ultimately dislodged material passes from the cathode to a substrate.

3 Claims, 6 Drawing Figures

COLD CATHODE ION BEAM SOURCE

BACKGROUND

Ion beams can be and are used in sputtering techniques, substrate cleaning, co-deposition of materials, ion assisted deposition and ion sputtering. The present device can be and is advantageously used in any and all of the above mentioned applications. However, the present device per se, and the utility of the present device will be described in connection with the fabrication of a thin film device through ion assisted deposition, by way of example.

It is well understood that, if ion beams are employed in an ion assisted deposition during the preparation of thin film devices, the resulting thin films are characterized by many desirable properties which are otherwise not present. For instance there is improved film packing density, improved stoichiometry and improved adhesion. The technique of using ion beams as part of a thin film deposition activity has also been used to modify stress in the deposited film and to reduce water vapor absorption as related to the film deposition. In particular with regard to optical thin film coatings, the refractive index is increased and the optical thin film stacks possess greater (long term) stability. It is believed that ion bombardment, of both the substrate and the material being deposited, removes atoms that are not firmly entrenched in the substrate while at the same time other atoms of the material are driven more completely into the substrate. In addition greater surface mobility for condensing atoms is provided. As should be apparent a film characterized by denser packing and better adhesion results, if an ion beam is employed during thin film deposition.

In a number of ion involved applications, an ion source capable of producing ions over a broad area, in response to applied low energy and low current, is required. In the prior art it has become the practice to employ a hot cathode along with a magnetic multipole source in order to obtain large area beams of ions having sufficient current density and beam energy. Hot cathode sources are very versatile and can be designed to produce beams of different sized areas and different current and energy intensities. However since the hot cathode devices employ hot filament cathodes to thermionically supply electrons, these arrangements have relatively short lifetimes, i.e. matters of hours. Typically for a 0.4 mm diameter tungsten wire, the filament lifetime is in the order of a few hours. If larger diameters are used, such as 1.5 mm, the lifetime may be 10 to 30 hours. However, thicker filaments require higher heating currents for instance in the range of 60 to 70 amperes. In addition hot filaments have been found to require large ionization discharge chambers as well as large power sources.

The present system, which is a cold cathode system, provides all of the desirable features of a hot filament, magnetic multipole source, while not requiring a large ionization discharge chamber and not being characterized by a short filament lifetime.

SUMMARY

In a preferred embodiment of the present device, a permanent magnet is formed in a circle and has a substantial depth dimension. While in the preferred embodiment the permanent magnet is formed in a circle it should be understood that it can be formed in other shapes such as a rectangle, or a circular magnet fitting within a larger circular magnet, etc. The magnet, along its depth dimension, is formed concave, i.e. substantially in the shape of the letter "C" (or its mirror image depending upon where its cross-section is viewed). The top side of the magnetic ring is formed as a north pole and the bottom as a south pole (or vice versa) so that magnetic flux passes out of the top of the magnetic ring into the bottom. Since the magnetic ring is concave shaped on its inside aperture surface, the magnetic flux concentrates at the upper end of the "C" shaped configuration and passes into the lower end of the "C" shaped configuration. Accordingly there is an enclosure formed by the heavy magnetic flux passing between the upper and lower ends of the "C" shaped section of the magnetic ring and the pocket, or trench, formed by the concave inside surface of the ring. The present arrangement provides for having an anode element located in the enclosure just described. The anode is electrically isolated from the ring magnet. Accordingly the anode is shielded by the magnetic flux. At the bottom end of the ring shaped magnet, and formed to lie at the end of the aperture in the ring, is a cathode element. The cathode is decoupled, i.e. not permanently attached to the magnetic ring, however it is in abutment therewith, or electrically connected thereto. In a preferred embodiment as just mentioned, the cathode element is electrically connected to the ring magnet so that they are at the same electrical potential. At the top of the ring aperture there is located a grid element, or screen, which is connected to the ring magnet and which therefore is at the same voltage value as the cathode. Finally the arrangement has a second aperture formed, either through the cathode or through the ring magnet, to permit ionizable fluid, such as oxygen, nitrogen, argon, or the like, (or any other material to be ionized) to be inserted into the region within the ring so that when an electrostatic field is produced between the anode and cathode, the ionizable gas is transformed into a dense plasma and ions become available to pass through the screen in the form of an ion beam.

The objects and features of the present invention will be better understood in view of the following discussion taken in conjunction with the drawings in which.

Figure 1:
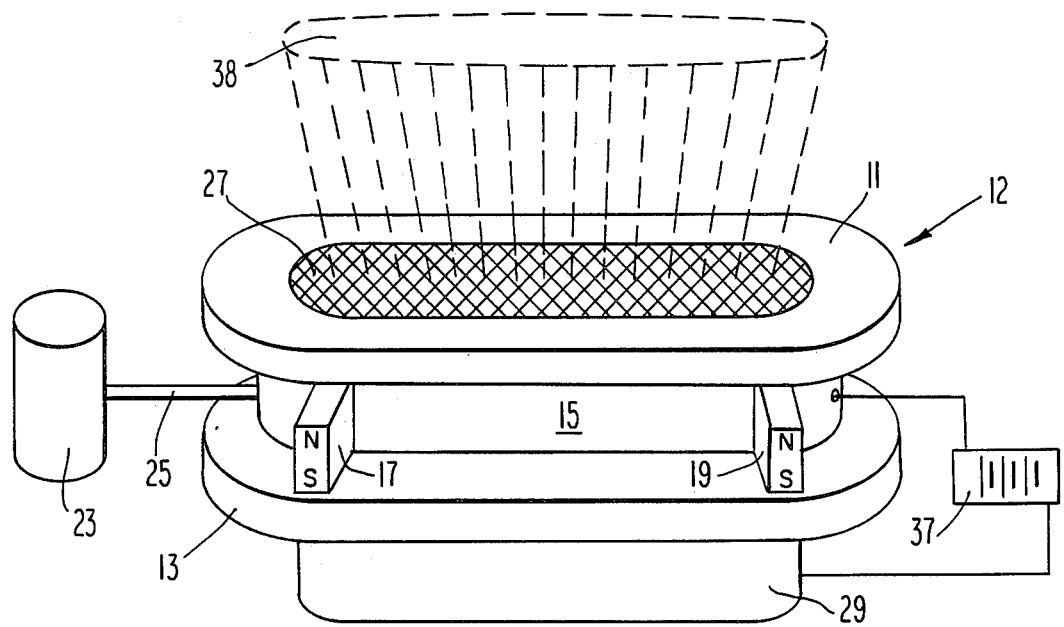
FIG. 1 is a pictorial view of the present device.
Figure 2:
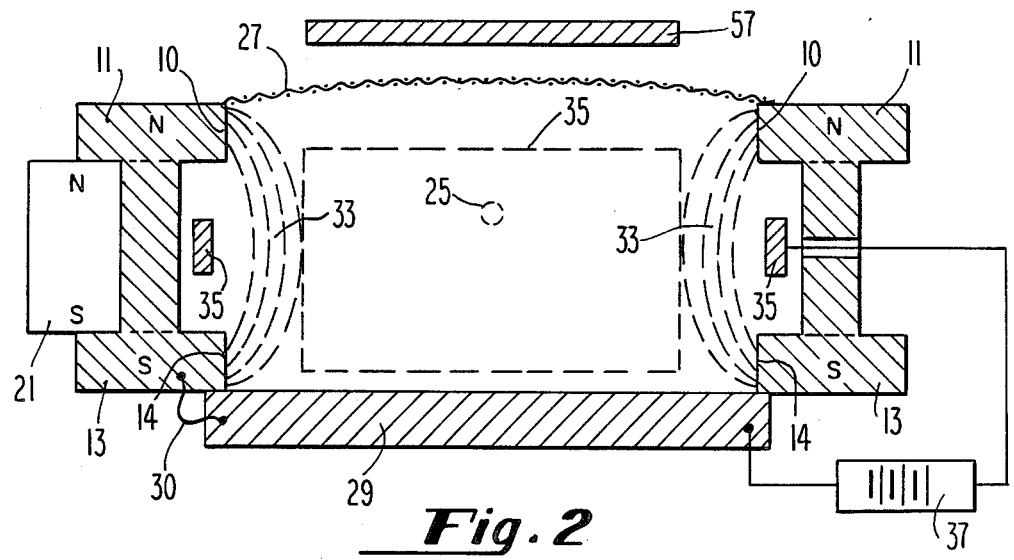
FIG. 2 is a cross sectional view of the present device.

Consider FIG. 1. In FIG. 1 there is shown a magnetic material flange-like plate 11, which acts as the upper section of a permanent magnet. The role of plate 11 as well as the remainder of the permanent magnet can be better understood from FIG. 2. In FIGS. 1 and 2 there is shown a lower soft iron, or magnetic material, flange-like plate 13. In between the plates 11 and 13, and in a support structure role, is a ring 15 which is made of non magnetic material. Located between the flanges 13 and 11 are a number of permanent magnet units, such as magnet units 17 and 19, shown in FIG. 1 and magnet unit 21 shown in FIG. 2. It should be understood that the soft iron flanges 11 and 13 and the plurality of permanent magnet units such as magnet units 17, 19 and 21 comprise together a large permanent magnetic ring 12. It should be understood that while there are shown only three permanent magnet units, more permanent magnet units can be and are employed depending on the gauss requirement. The magnetic flux units, such as magnetic flux units 17, 19 and 21, provide magnetic flux through the soft iron flange 11, from the flange end 10, through the gap between the flange end 10 and the flange end 14, through the lower soft iron flange 13. The magnetic flux is shown in FIG. 2 as flux 33. It should be understood that while the permanent magnet 12 is shown in the form of a ring other endless configurations such as a rectangle could be used. It should also be understood that while a permanent magnet is shown in a preferred embodiment, an electromagnet could be employed.

As can be seen in FIG. 1 there is a source 23 of ionizable fluid such as nitrogen. The nitrogen is fed from the source 23, through the pipe 25 into the center section of the large magnetic ring 12. The ionizable fluid or gas is fed into the center section in such a fashion as to cause numerous collisions within the center section. Fitted over the upper end opening of the large magnetic ring 12 is a grid member 27. Fitted over the lower opening of the large magnetic ring 12 is a cathode member 29. The cathode member 29, in a preferred embodiment, is made of carbon while the grid 27 is stainless steel. Other suitable materials can be used. The cathode 29, when not decoupled, is fitted with the permanent magnet 12 so as to be gas tight thus holding the ionizable gas within the chamber defined by the magnet and the cathode. Fitted into the enclosure 31, defined by the magnetic flux 33, the upper flange 11, the support member 15 and the lower flange 13, is an anode 35. In a preferred embodiment the anode 35 is made of stainless steel. The cathode 29 and the anode 35 are connected to a source of electrical power 37. The power source 37 is shown as a battery in FIG. 2 but it should be understood that other forms of d.c. power (or a.c. power for some applications) could be used.

When electrical power is connected to the anode 35 and the cathode 29 there is an electrostatic field developed therebetween. The electrostatic field, or electric field, formed between the cathode 29 and anode 35 lies substantially orthogonal to the lines of magnetic flux 33. When ionizable fluid, such as nitrogen, is inserted into the inner part of the magnetic ring 12, the fluid is transformed into plasma. The plasma is substantially confined to the region 36 (FIG. 2) by the magnetic flux (33) shield, by the negative potential of the cathode 29 and the shield 27. At the plasma boundries there are plasma transition regions referred to as sheaths. Sheaths are formed at points where the plasma is in contact with material walls. Within the plasma region 36 there are electrons which are repelled by both the cathode 29 and grid 27, and have difficulty passing through the flux field 33. The continual collisions between the electrons and the gas atoms free up ions within the plasma region and the ions pass toward the negative shield (grid) 27. Some of the ions strike the wires of the grid 27 and are neutralized thereat, while the majority of the ions pass through grid 27 in a cone shape such as the cone 38 (FIG. 1). A substantial number of ions also strike the cathode surface where they liberate electrons by secondary emission. The continuation of the discharge depends on these electrons. Together with the secondary electrons, ions also cause sputtering of the cathode surface. The ions in the cone 38 continue in their movement to strike a substrate and simultaneously to join with atoms of material to be deposited. The role of the ion source can be seen in FIG. 3.

Figure 3:
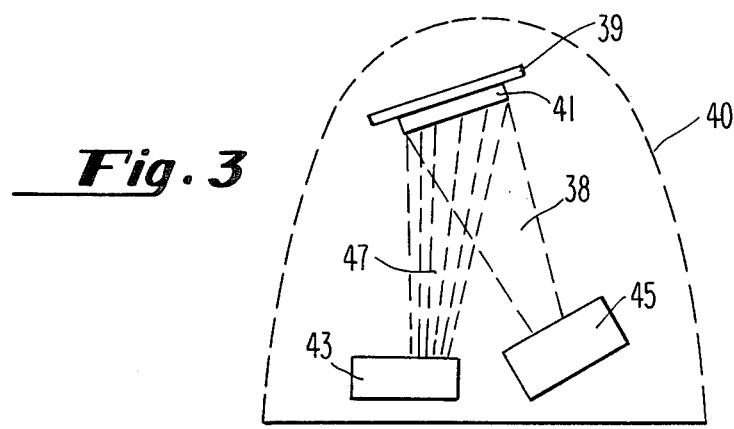
FIG. 3 is a block diagram depicting the present device in use as part of a thin film deposition.

In FIG. 3 there is shown, in dashed line, a vacuum chamber 40. Inside of the vacuum chamber 40 there is shown a workpiece holder 39 upon which there is located a substrate 41. The arrangement shown in FIG. 3 is employed to ion assist in the deposition of a thin film of the material from the boat 43 onto the substrate 41. As explained earlier if this deposition is done simultaneously with ion bombardment there results an improved thin film. The device shown in FIGS. 1 and 2 is depicted by box 45. The cone of ions 38 is shown in FIG. 3. The ions bombard the substrate 41 simultaneously with the atoms of material in the cone 47 and the improved thin film results.

Figure 4:
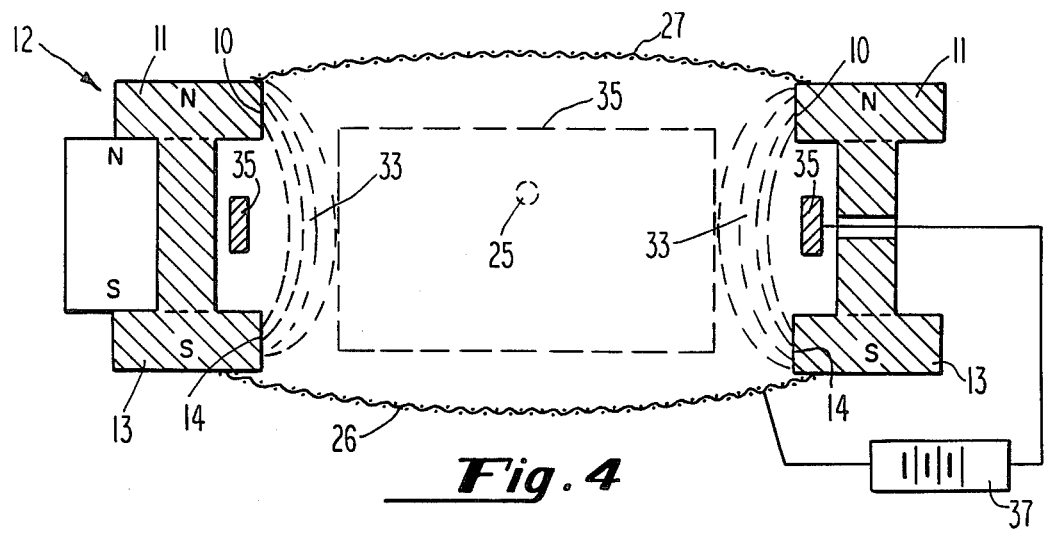
FIG. 4 is a side view of an embodiment of the present invention including two screens.
Figure 5:
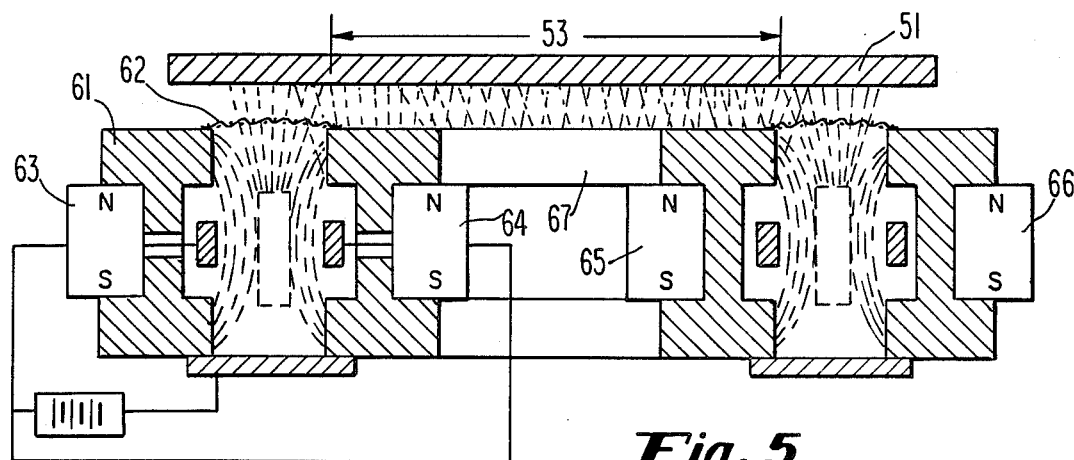
FIG. 5 is a side view of the present invention employing a double magnetic ring.
Figure 6:
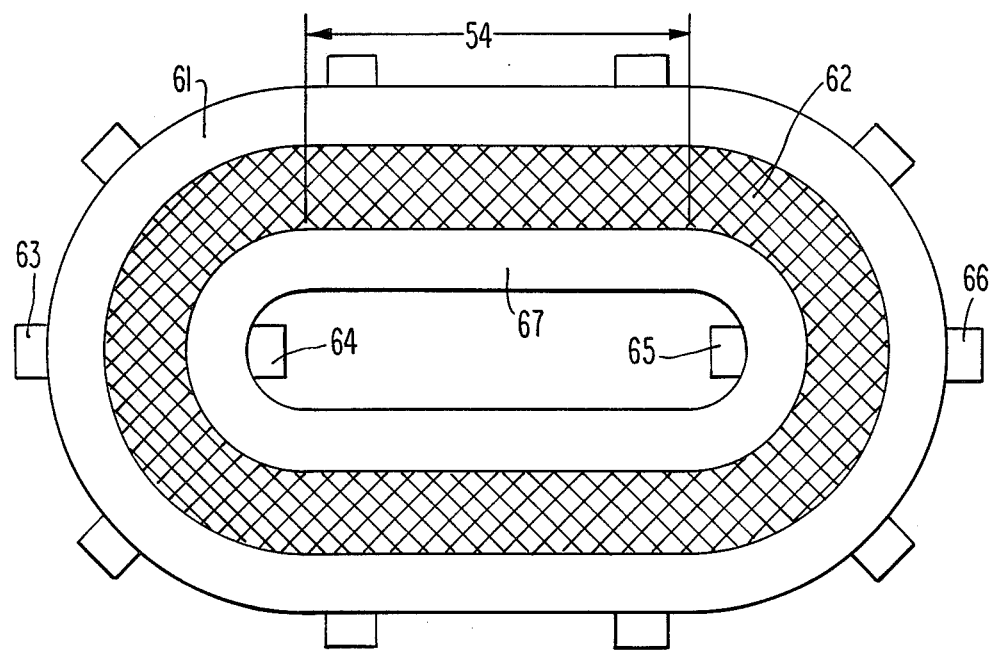
FIG. 6 is a top view of the embodiment of FIG. 5.

FIG. 4 depicts an embodiment with a screen 27 on the top and a screen 26 on the bottom. Actually the screens and the diameter of the magnetic ring could lie along a vertical direction. In any event the configuration of FIG. 4 is a device that provides ions through both screens, i.e., screen 27 and screen 26 and is useful in applications where a double ion source is required. In FIGS. 5 and 6 there is shown a double magnetic ring which provides a circular track of ions. The embodiment of FIG. 5 can be employed to ion scrub, or to ion assist in deposition, to ion co-deposit, to sputter or to ion sputter with respect to large substrates. If we look at the substrate 51 in FIG. 5, it can be seen that as the substrate is moved over the double ring device, its large surface is subject to ion bombardment. The ions passing to the substrate 51 along the section 53 emanate from section 54 of the track shown in FIG. 6. If such ion bombardment of a large substrate were accomplished in the prior art, a large source would be required whereas with the present device the narrow track enables the ion bombardment of a large substrate.

In the description thus far we have considered the present device as an ion source while in fact it can be used as a sputtering source. In one mode of operation the ions can be used to sputter the cathode. When the present device is operating, in the mode shown in FIG. 2, as an ion source, some sputtering takes place. The foregoing is true because the ions bombard the cathode 29 and dislodge material therefrom. The above described sputtering is reduced by carbon coating the cathode 29 and/or by reducing the difference in potential between the anode 35 and the cathode 29. However there are applications when sputtering would be desirable. For instance if the present device were used to produce a thin film of aluminum, then the cathode would be made of aluminum. The ions from the plasma region 35 would dislodge particles of aluminum from the cathode and such particles would pass to a substrate 57 lying in the position as shown. In such an application it might be useful not to employ the screen 27. It should also be understood, as mentioned above, that the present device can be used to ion beam sputter, i.e., to ion beam bombard material from a target for deposition on a substrate, rather than from the cathode.

As compared with the prior art it should be recognized that the present device is configured to readily decouple the cathode from the magnet. To say that another way, the cathode can readily be replaced by another cathode of different material to provide different sputtering sources. The erosion is uniform because the plasma is substantially uniform. For instance over 50% of the cathode target is eroded. Because the cathode is movable a larger cathode (more cathode material) can be originally employed and be moved as it is used before the cathode per se has to be replaced.

The improved ion source of the present device is accomplished principally because of the unique confinement of the plasma. The pressure of the ionizable fluid and the presence of the electrostatic field creates the avalanche of ionization (a plasma) which may be uniform, or non-uniform. The plasma is confined and is dense because: the electrons follow the magnetic flux lines and bounce between the ends 10 and 14; the E×B effect keeps the electrons moving; and finally if the electrons attempt to move out of the plasma region they are repelled and bump into atoms of the gas thus freeing up ions. The ions in turn (when they drift from the plasma) seek a negative potential in particular the screen 27 and while some strike the screen, the majority pass therethrough. The ions may sputter the cathode but this effect can be mitigated by using cathodes made of materials with a low sputtering coefficient such as carbon. The present device has many of the attributes of a hot cathode ion source but with much longer cathode life and less overall power requirements. The arrangement of the permanent magnet with the concave inner surface to form an enclosure between the magnetic flux and the inner surface is an improved means to providing the magnetic flux. The foregoing is true because the anode is located within the enclosure and is thus shielded. This arrangement permits the cathode to be decoupled and have the magnetic flux tied to a negative potential which repels the electrons as they follow the magnetic flux.

I claim:

1. A cold cathode ion beam source comprising in combination: first and second magnetic flux conducting means with each formed into an endless configuration having a relatively large aperture therethrough, first separation means formed of material which does not conduct magnetic flux and formed into an endless configuration having an aperture therethrough which aperture is larger than said relatively large aperture, said first separation means disposed to separate said first and second magnetic flux conducting means and provide a common aperture, with first and second ends, passing through said first magnetic flux conducting means, through said first separation means, and through said second magnetic flux conducting means said common aperture having an inside surface formed to be concave with said first and second magnetic flux conducting means providing first and second ends of said concave configuration; magnetic flux source means disposed in close proximity to said first and second magnetic flux conducting means to provide flux passing from said first end to said second end of said concave formed inside surface, thereby creating a first enclosure between said last mentioned magnetic flux and said concave formed inside surface; third and fourth magnetic flux conducting means separated by second separation means, said second separation means formed of material which does not conduct magnetic flux and disposed with respect to said third and fourth magnetic flux conducting means to form a second concave surface made up by part of said third magnetic flux conducting means, by said second separation means, and by part of said fourth magnetic flux conducting means, said third and fourth magnetic flux conducting means formed to fit within said common aperture and disposed to provide a gap between the combination of said first and second magnetic flux source means and the combination of said third and fourth magnetic flux conducting means, second magnetic flux source means disposed in close proximity to said third and fourth magnetic flux conducting means to provide flux to pass therethrough, said second concave surface designed to be a mirror image of said concave formed inside surface whereby magnetic flux provided by said second magnetic flux source means passes from a first end to a second end of said second concave surface thereby creating a second enclosure, and said second enclosure being between said last mentioned magnetic flux and said second concave surface; first and second anode means respectively disposed within said first and second enclosures; cathode means disposed along said gap; electrical power means connected to said cathode and said anodes to cause an electrostatic field therebetween whereby a region of plasma can be formed in said gap; ionizable fluid disposed in said gap so that when electrical energy is applied to said cathode and to said anodes a plasma forms along said gap.

2. A cold cathode ion beam source according to claim 1 wherein there is further included a screen formed to be over said gap and connected to said first and second magnetic flux means to have the same electrical voltage value thereof.

3. A cold cathode ion beam source according to claim 1 wherein said cathode is decoupable.

* * * * *